(12) United States Patent
Ok (10) Patent No.: US 9,046,551 B2
(45) Date of Patent: Jun. 2, 2015

(54) VOLTAGE DETECTION CIRCUIT AND INTERNAL VOLTAGE GENERATOR USING THE SAME

(71) Applicant: SK hynix Inc., Gyeonggi-do (KR)

(72) Inventor: Seung-Han Ok, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/086,664

(22) Filed: Nov. 21, 2013

(65) Prior Publication Data

US 2014/0368263 A1   Dec. 18, 2014

(30) Foreign Application Priority Data

Jun. 18, 2013   (KR) .......................... 10-2013-0069714

(51) Int. Cl.
| | |
|---|---|
| *G11C 5/14* | (2006.01) |
| *G05F 3/08* | (2006.01) |
| *G01R 19/00* | (2006.01) |
| *G05F 1/10* | (2006.01) |

(52) U.S. Cl.
CPC .............. *G01R 19/0084* (2013.01); *G05F 1/10* (2013.01)

(58) Field of Classification Search
None
See application file for complete search history.

(56) References Cited

U.S. PATENT DOCUMENTS

| | | | | |
|---|---|---|---|---|
| 4,544,878 | A * | 10/1985 | Beale et al. ................... | 323/315 |
| 7,042,280 | B1 * | 5/2006 | Huang et al. .................. | 327/541 |
| 8,310,277 | B2 * | 11/2012 | Su et al. .......................... | 327/58 |
| 2006/0274595 | A1 * | 12/2006 | Byeon et al. .................. | 365/226 |

FOREIGN PATENT DOCUMENTS

KR       1020120068228       6/2012

* cited by examiner

*Primary Examiner* — Lincoln Donovan
*Assistant Examiner* — Terry L Englund
(74) *Attorney, Agent, or Firm* — IP & T Group LLP (57) ABSTRACT

A voltage detection circuit includes a voltage detection unit suitable for comparing a voltage level of a reference voltage terminal with a voltage level of an internal voltage terminal and for generating a detection signal based on a comparison result, a test reference voltage generating unit suitable for receiving an external reference voltage through a pad and for supplying a test reference voltage, which is generated by using the received external reference voltage, to the reference voltage terminal by using a first input resistance, during a test operation, and a normal reference voltage generating unit having a current mirror structure, wherein the normal reference voltage generating unit is suitable for supplying a current, corresponding to an internal reference voltage, to the reference voltage terminal by using a second input resistance different from the first input resistance, during a normal operation.

11 Claims, 8 Drawing Sheets

VOLTAGE DETECTION CIRCUIT AND INTERNAL VOLTAGE GENERATOR USING THE SAME

CROSS-REFERENCE TO RELATED APPLICATIONS

The present application claims priority of Korean Patent Application No. 10-2013-0069714, filed on Jun. 18, 2013, which is incorporated herein by reference in its entirety.

BACKGROUND

1. Field

Exemplary embodiments of the present invention relate to a semiconductor design technology, and more particularly, to a voltage detection circuit and an internal voltage generator using the same.

2. Description of the Related Art

Generally, a semiconductor device such as a double data rate synchronous dynamic random access memory (DDR SDRAM) includes an internal voltage generator. The semiconductor device may operate stably using internal voltages having various voltage levels generated from an internal voltage generator. There are generally two types of internal voltages. One is generated by down-converting a power supply voltage supplied from an external device, and another is generated by charge-pumping using the power supply voltage or a ground voltage. For example, in a DDR SDRAM, the former may be used as a core voltage and a precharge voltage. The latter may be used as a boosted voltage (e.g., an activation voltage for word lines) or a negative voltage (e.g., a substrate bias voltage for cell transistors).

As semiconductor devices are highly integrated, a design rule of a sub-micron level is applied to the design of an internal circuit, and a voltage level of a power supply voltage is lowered for a high speed. Thus, a design and a manner for generating a stable internal voltage using a low power supply voltage have been developed. Especially, since a circuit for generating a negative voltage has an influence on a minute noise of a power supply voltage, which is supplied from an exterior, a special attention is required in a design a circuit.

Figure 1:
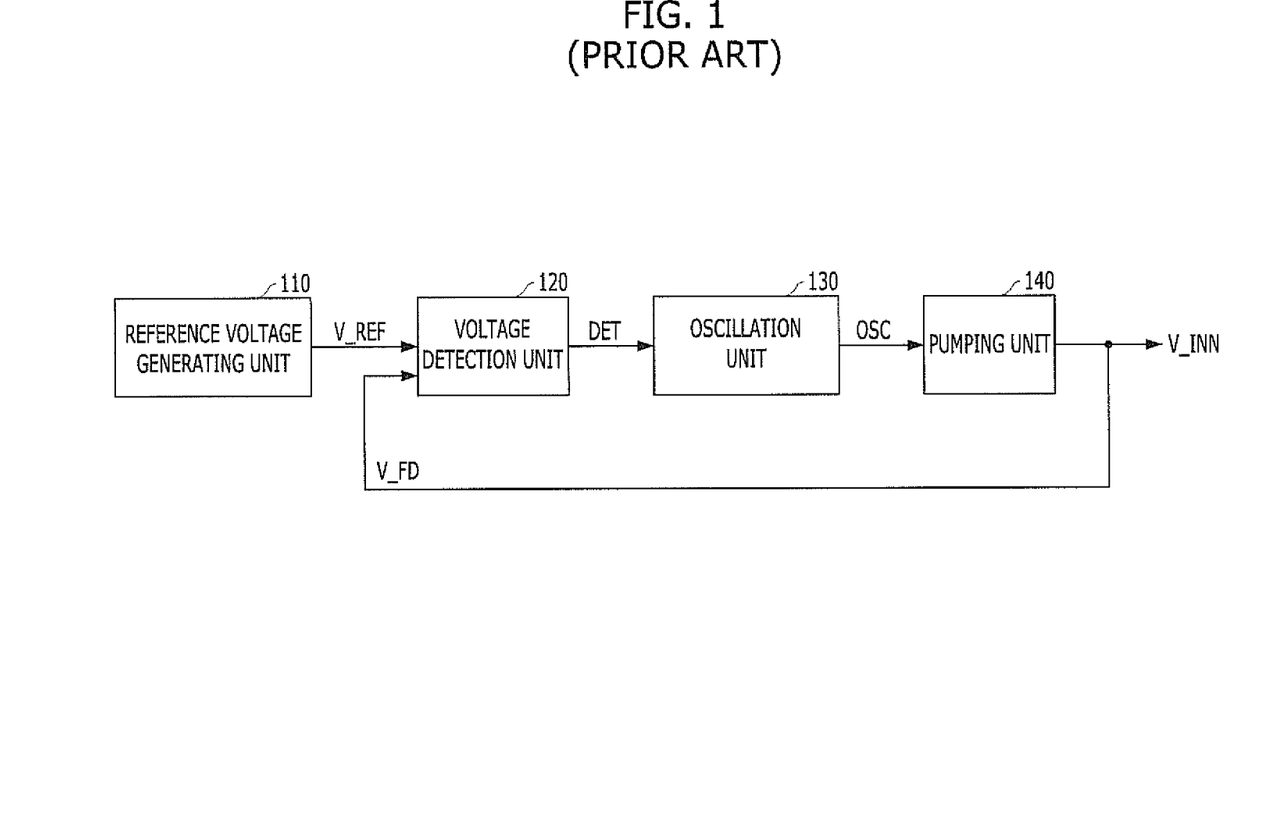
FIG. 1 is a block diagram illustrating a conventional internal voltage generator.

FIG. 1 is a block diagram illustrating a conventional internal voltage generator.

Referring to FIG. 1, a conventional internal voltage generator includes a reference voltage generating unit 110, a voltage detection unit 120, an oscillation unit 130, and a pumping unit 140.

The reference voltage generating unit 110 generates a reference voltage V_REF having a voltage level corresponding to an internal voltage V_INN. The voltage detection unit 120 compares a voltage level of the reference voltage V_REF with that of a feedback voltage V_FD and generates a detection signal DET based on a comparison result. That is, the voltage detection unit 120 generates the detection signal DET by detecting voltage level of the feedback voltage V_FD based on the voltage level of the reference voltage V_REF.

The oscillation unit 130 generates an oscillation signal OSC in response to the detection signal DET. The pumping unit 140 receives the oscillation signal OSC and generates an internal voltage V_INN by using a charge pumping operation. The internal voltage V_INN is fed back to the voltage detection unit 120.

Figure 2:
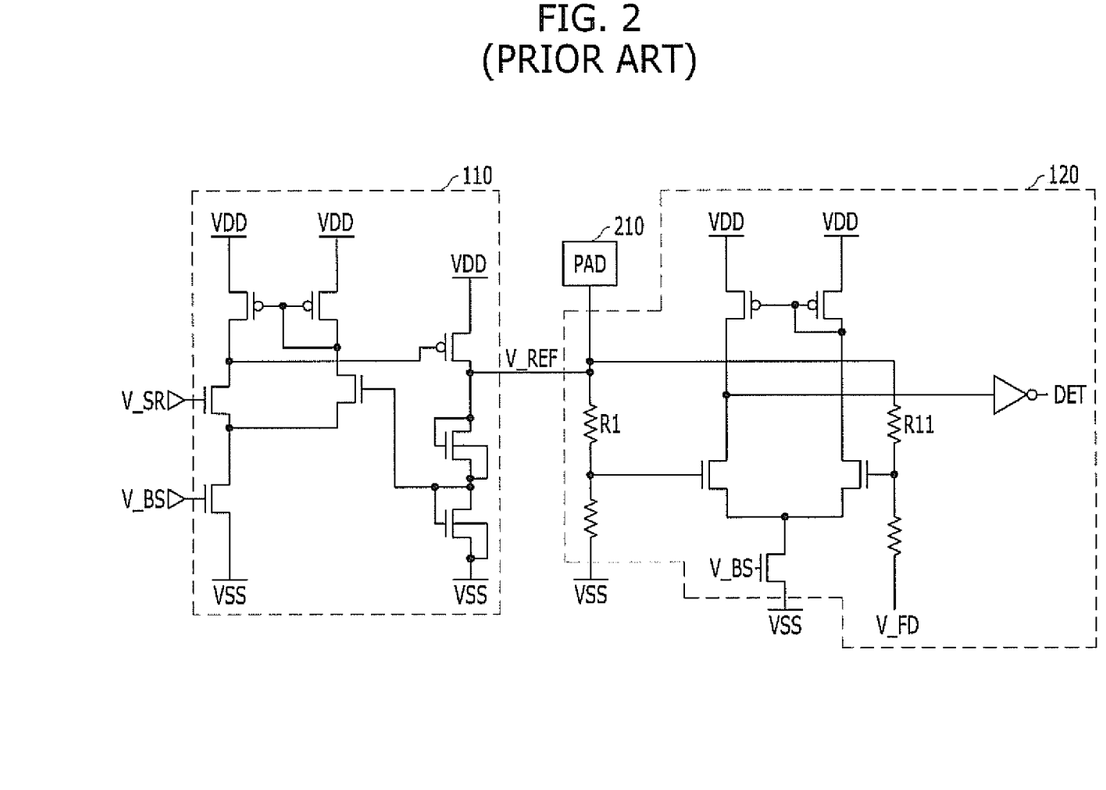
FIG. 2 is a detailed diagram illustrating a reference voltage generating unit and a voltage detection unit shown in FIG. 1.

FIG. 2 is a detailed diagram illustrating the reference voltage generating unit 110 and the voltage detection unit 120 shown in FIG. 1.

Referring to FIG. 2, the reference voltage generating unit 110 receives a source reference voltage V_SR and a bias voltage V_BS and generates the reference voltage V_REF. The voltage detection unit 120 compares the voltage level of the reference voltage V_REF with that of the feedback voltage V_FD and generates the detection signal DET based on a comparison result.

Meanwhile, a semiconductor device including a semiconductor memory device is required to perform a test operation (or a test mode) prior to commercialization, and the semiconductor device, which passes the test operation, is provided to a user.

The internal voltage generator shown in FIG. 1 may perform a test operation. A pad 210 receives an external reference voltage corresponding to the reference voltage V_REF during the test operation, and the voltage detection unit 120 uses the external reference voltage, which is received through the pad 210, as the reference voltage during the test operation.

Hereinafter, a test operation for the internal voltage generator will be described as below with reference to FIGS. 1 and 2.

The voltage detection unit 120 receives the external reference voltage through the pad 210 during a test operation. Herein, the external reference voltage has a voltage level corresponding to the reference voltage V_REF used in a normal operation (or a normal mode). The voltage detection unit 120 detects the feedback voltage V_FD using the external reference voltage. Then, the oscillation unit 130 generates the oscillation signal OSC in response to the detection signal DET. The pumping unit 140 generates the internal voltage V_INN in response to the oscillation signal OSC.

Generally, the internal voltage V_INN has a dispersion value, which is determined by a characteristic value of a unit circuit forming the voltage detection unit 120. Herein, a small dispersion value of the internal voltage V_INN represents that the internal voltage V_INN is stable. On the other hand, a large dispersion value of the internal voltage V_INN represents that the internal voltage V_INN is unstable. Thus, it may be preferable that the unit circuit forming the voltage detection unit 120 is designed to have the smallest dispersion value possible.

Referring to FIG. 2, when first resistors R1 and R11 of the voltage detection unit 120 are designed to have a high resistance, the dispersion value of the internal voltage V_INN becomes small. On the other hand, when first resistors R1 and R11 of the voltage detection unit 120 are designed to have a high resistance, some concerns occur as below. Here, the first resistors R1 and R11 are designed to have the same resistance.

In the test operation, since the external reference voltage inputted through the pad 210 may be increased to a level corresponding to a resistance of the first resistors R1 and R11, it may be possible to design the first resistors R1 and R11 having a high resistance. However, when the first resistors R1 and R11 have the high resistance, it may be impossible to perform a normal operation using a low power supply voltage. Thus, the first resistors R1 and R11 are designed to have a low resistance under the normal operation. However, this may cause the internal voltage V_INN to have a large dispersion value during the test operation, as described above.

Accordingly, a test result using the internal voltage V_INN may not be reliable since the dispersion value of the internal voltage is increased by the first resistors R1 and R11 having a low resistance.

SUMMARY

Exemplary embodiments of the present invention are directed to an internal voltage generator for minimizing a dispersion value of an internal voltage during a test operation.

In accordance with an embodiment of the present invention, a voltage detection circuit includes a voltage detection unit suitable for comparing a voltage level of a reference voltage terminal with a voltage level of an internal voltage terminal and for generating a detection signal based on a comparison result, a test reference voltage generating unit suitable for receiving an external reference voltage through a pad and for supplying the received external reference voltage to the reference voltage terminal as the reference voltage by using a first input resistance, during a test operation, and a normal reference voltage generating unit having a current mirror structure, wherein the normal reference voltage generating unit is suitable for generating an internal reference voltage, and for supplying the internal reference voltage to the reference voltage terminal as the reference voltage by using a second input resistance different from the first input resistance, during a normal operation.

In accordance with another embodiment of the present invention, an operation method of a voltage detection circuit includes receiving an external reference voltage through a pad to generate a test reference voltage by using the received external reference voltage, during a test operation, detecting a voltage level of a target internal voltage based on a voltage level of the test reference voltage during the test operation, forming a mirror current using a current mirror structure to generate a normal reference voltage by using the mirror current, during a normal operation, and detecting the voltage level of the target internal voltage based on a voltage level of the normal reference voltage during the normal operation.

In accordance with another embodiment of the present invention, a voltage detection unit suitable for comparing a voltage level of an internal voltage terminal with a voltage level of a reference voltage terminal and for generating a detection signal based on a comparison result, a test reference voltage generating unit suitable for receiving an external reference voltage through a pad during a test operation, and for supplying the received external reference voltage to the reference voltage terminal as the reference voltage by using a first input resistance, during a test operation, a normal reference voltage generating unit having a current mirror structure, wherein the normal reference voltage generating unit is suitable for generating an internal reference voltage, and for supplying the internal reference voltage to the reference voltage terminal as the reference voltage by using a second input resistance different from the first input resistance, during a normal operation, an oscillation unit suitable for generating an oscillation signal in response to the detection signal, and a pumping unit suitable for generating a negative voltage by using a charge pumping operation based on the oscillation signal, and supplying the negative voltage to the internal voltage terminal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
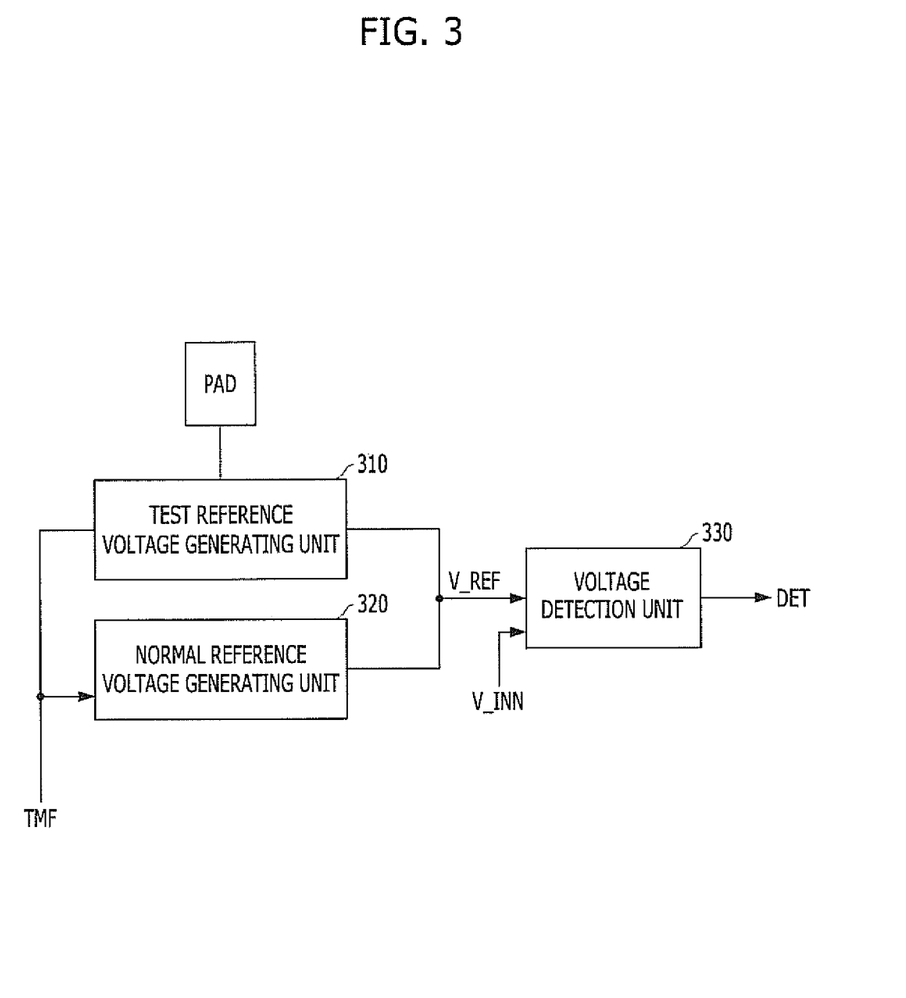
FIG. 3 is a block diagram illustrating a voltage detection circuit in accordance with an embodiment of the present invention.

FIG. 3 is a block diagram illustrating a voltage detection circuit in accordance with an embodiment of the present invention.

Referring to FIG. 3, a voltage detection circuit includes a test reference voltage generating unit 310, a normal reference voltage generating unit 320, and a voltage detection unit 330.

The test reference voltage generating unit 310 generates a reference voltage V_REF corresponding to a first input resistance in response to a test mode signal TMF. The normal reference voltage generating unit 320 generates a reference voltage V_REF corresponding to a second input resistance in response to the test mode signal TMF. Herein, the test mode signal TMF is a control signal for designating a test operation and a normal operation. The first input resistance and the second input resistance may be designed to be different from each other. The first input resistance used in the test operation may be designed to have a value higher than the second input resistance used in the normal operation. Subsequently, the voltage detection unit 330 compares a voltage level of the reference voltage V_REF with that of an internal voltage V_INN (or a target voltage) to be detected, and generates a detection signal DET based on a comparison result.

The voltage detection circuit may have different input resistances corresponding to the reference voltage V_REF during the test operation and the normal operation. Especially, the stability of a circuit operation may be raised by increasing the input resistance corresponding to the reference voltage V_REF during the test operation.

Figure 4:
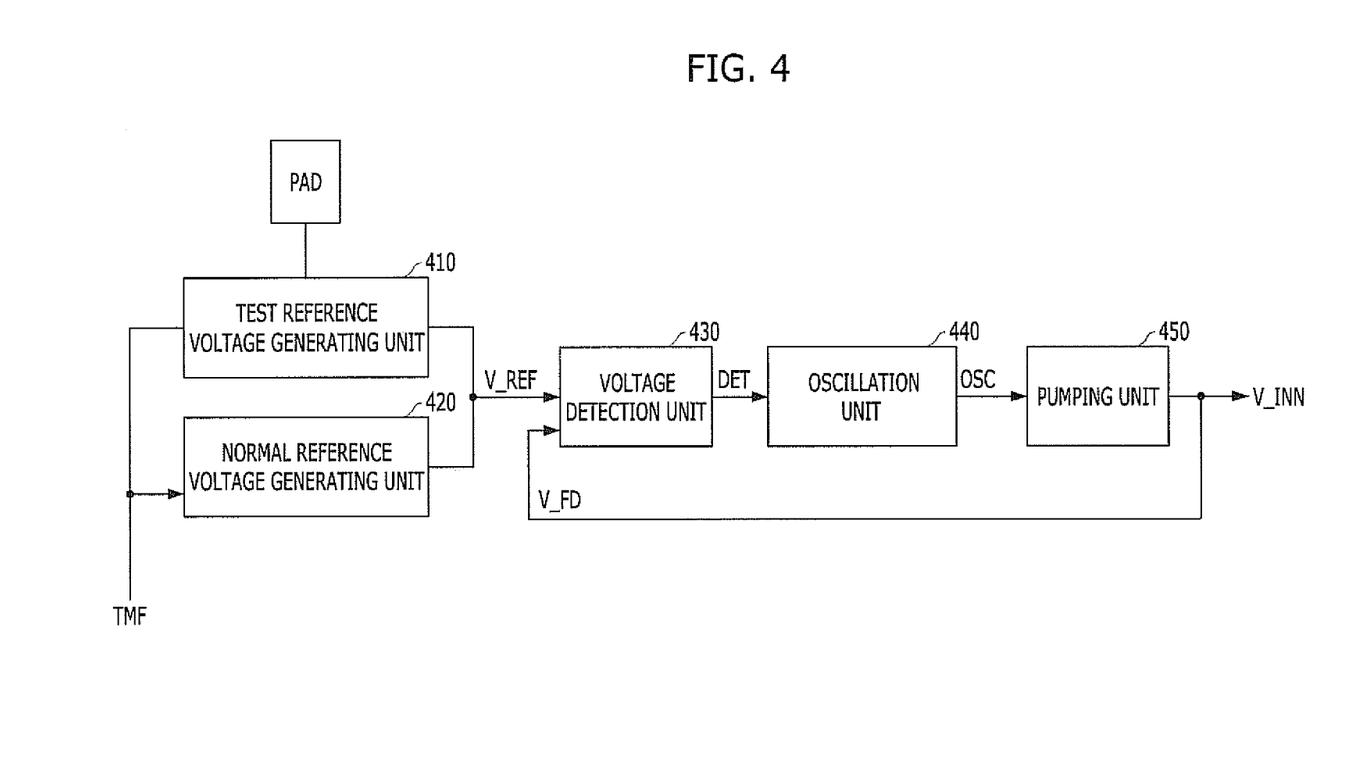
FIG. 4 is an internal voltage generator in accordance with an embodiment of the present invention.

FIG. 4 is an internal voltage generator in accordance with an embodiment of the present invention.

Referring to FIG. 4, the internal voltage generator includes a test reference voltage generating unit 410, a normal reference voltage generating unit 420, a voltage detection unit 430, an oscillation unit 440, and a pumping unit 450.

The test reference voltage generating unit 410 and the normal reference voltage generating unit 420 generate a reference voltage V_REF in response to a test mode signal TMF. The voltage detection unit 430 compares a voltage level of the reference voltage V_REF and that of a feedback voltage V_FD, and generates a detection signal DET based on a comparison result. The oscillation unit 440 generates an oscillation signal OSC in response to the detection signal DET. The pumping unit 450 receives the oscillation signal OSC and generates an internal voltage V_INN (e.g., a negative voltage) by a charge pumping operation. Subsequently, the internal voltage V_INN is fed back to the voltage detection unit 430 as the feedback voltage V_FD.

That is, the internal voltage generator may detect the internal voltage V_INN using the test reference voltage generating unit 410 and the normal reference voltage generating unit 420. The test reference voltage generating unit 410 receives an external reference voltage through a pad PAD, and generates the reference voltage V_REF. The normal reference voltage generating unit 420 generates the reference voltage V_REF using a current mirror structure. Herein, as described in the test reference voltage generating unit 420, to generate the reference voltage (i.e., a test reference voltage) using the external reference voltage is defined as 'voltage supply type'. As described in the normal reference voltage generating unit 420, to generate the reference voltage (i.e., a normal reference voltage or an internal reference voltage) using a current mirror structure is defined as 'current supply type'.

The internal voltage generator uses the voltage supply type during the test operation and uses the current supply type during the normal operation when the voltage detection operation is performed.

Figure 5:
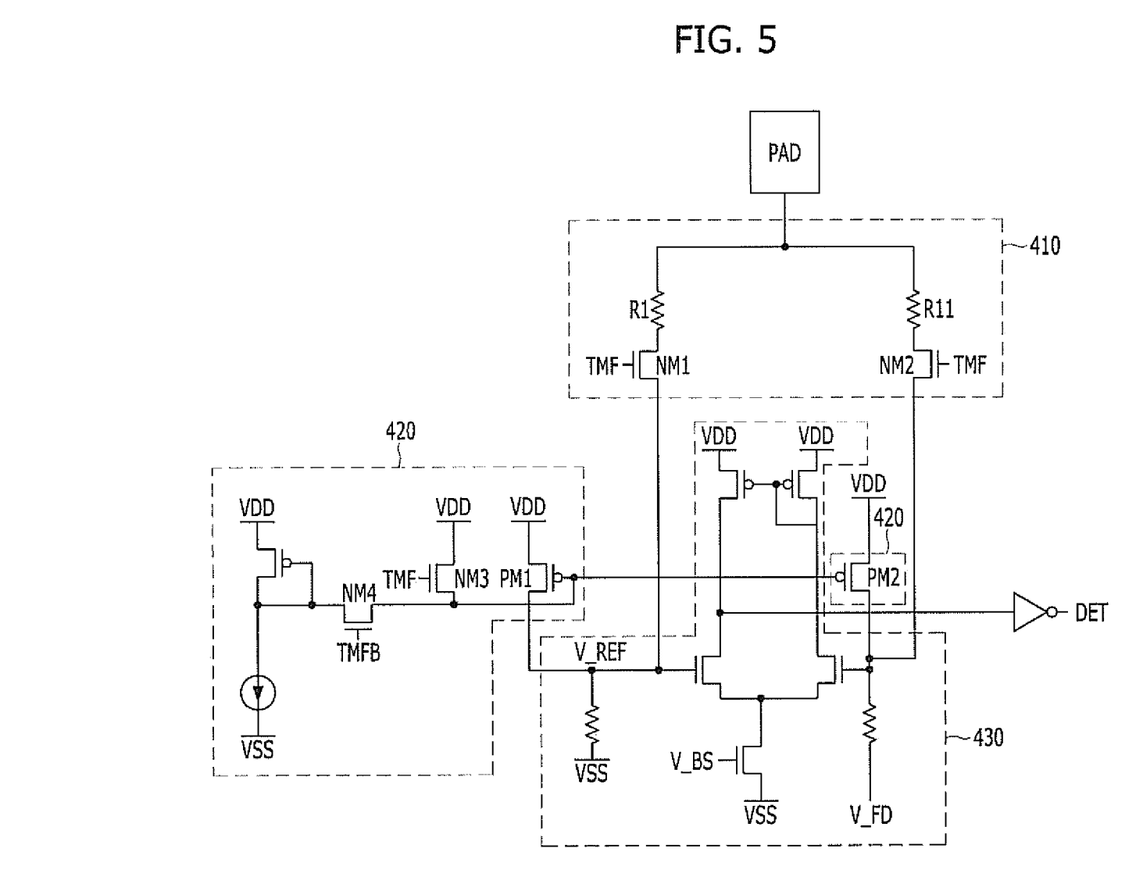
FIG. 5 is a detailed diagram illustrating a reference voltage generating unit, a normal reference voltage generating unit, and a voltage detection unit shown in FIG. 4.
Figure 6:
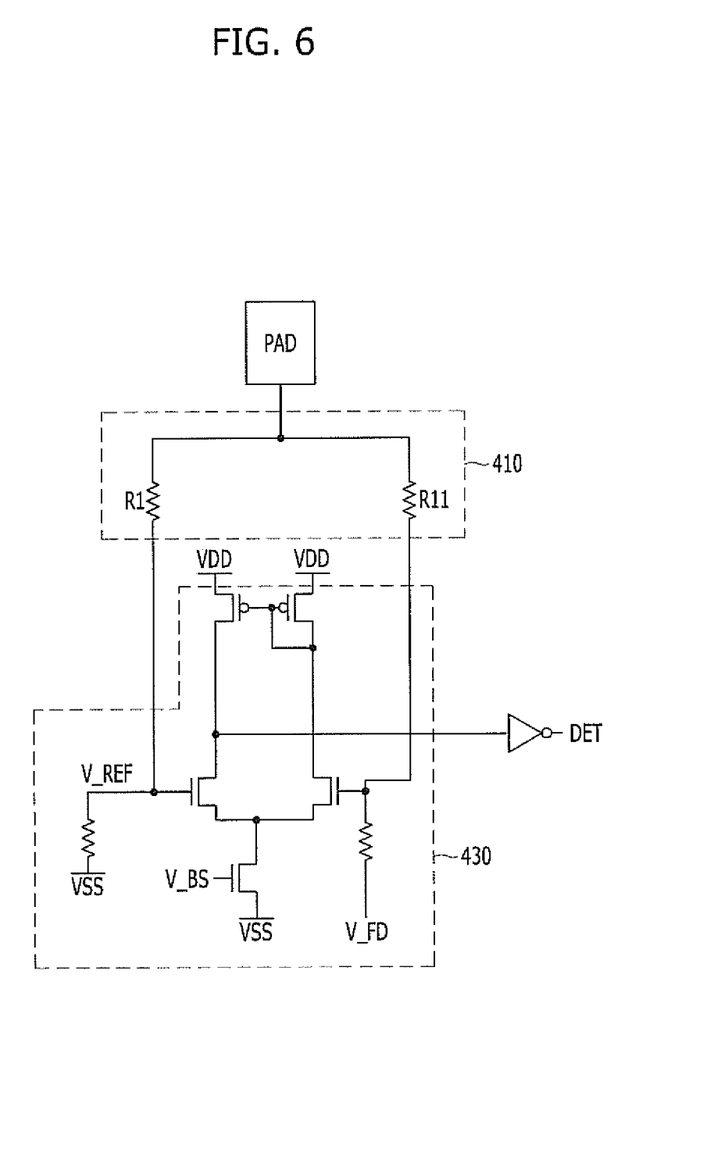
FIG. 6 is a circuit diagram for explaining a test operation of the circuit of FIG. 5.
Figure 7:
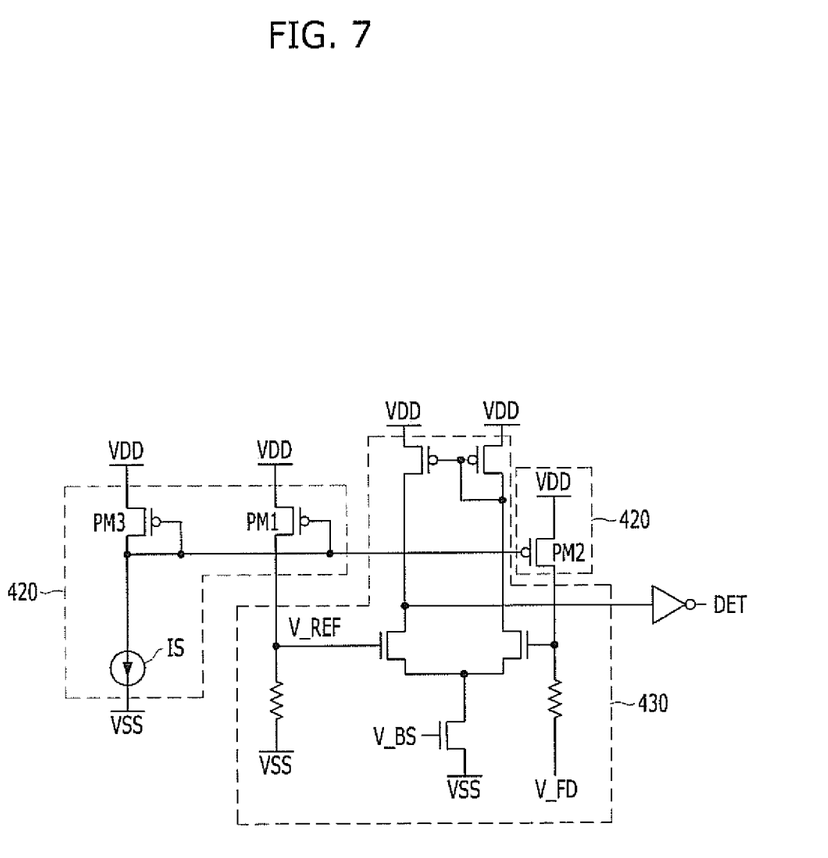
FIG. 7 is a circuit diagram for explaining a normal operation of the circuit of FIG. 5.

FIGS. 5 to 7 are detailed diagrams illustrating the test reference voltage generating unit 410, the normal reference voltage generating unit 420, and the voltage detection unit 430 shown in FIG. 4, and especially, illustrate an exemplary circuit for generating a negative voltage of internal voltages. Thus, the feedback voltage V_FD represents a voltage that the negative voltage generated by the charge pumping operation is fed back.

FIG. 5 is a detailed diagram illustrating the reference voltage generating unit 410, the normal reference voltage generating unit 420, and the voltage detection unit 430 shown in FIG. 4. FIG. 6 is a circuit diagram for explaining a test operation of the circuit of FIG. 5. FIG. 7 is a circuit diagram for explaining a normal operation of the circuit of FIG. 5.

For the convenience of the descriptions, the test reference voltage generating unit 410, the normal reference voltage generating unit 420, and the voltage detection unit 430 will be described in FIGS. 6 and 7, and first to fourth NMOS transistors NM1, NM2, NM3, and NM4, which receive a pair of test mode signals TMF and TMFB, will be described in FIG. 5.

Referring to FIG. 5, the first and second NMOS transistors (i.e., a switching unit) NM1 and NM2 control a connection between the test reference voltage generating unit 410 and the voltage detection unit 430 in response to the test mode signal TMF. The third and fourth NMOS transistors (i.e., an activation control unit) NM3 and NM4 control an activation or inactivation operation of first and second PMOS transistors PM1 and PM2 in response to a pair of the test mode signals TMF and TMFB. Herein, it is assumed that the test mode signal TMF has a logic high level during the test operation and a logic low level during the normal operation. An inverted test mode signal TMFB is an inverted signal for a complementary signal) of the test mode signal TMF. That is, during the test operation, the first to third NMOS transistors NM1 to NM3 are turned on, and the fourth NMOS transistor NM4 is turned off. During the normal operation, the first to third NMOS transistors NM1 to NM3 are turned off and the fourth NMOS transistor NM4 is turned on.

Hereinafter, during the test operation, the operation of the test reference voltage generating unit 410 and the voltage detection unit 430 will be described with reference to FIG. 6.

During the test operation, the test reference voltage generating unit 410 receives an external reference voltage through a pad PAD and generates the reference voltage V_REF using first resistors R1 and R11. Herein, a resistance of the first resistors R1 and R11 may be set to have a high resistance. Such resistance setting may be the basis for minimizing a dispersion value of a negative voltage generated during the test operation. Further, the first resistors R1 and R11 may have the same resistance. Since the first resistors R1 and R11 and the voltage detection unit 430 are disconnected from each other by the first and second NMOS transistors NM1 and NM2 during the normal operation, the first resistors R1 and R11 may be set to have a high resistance.

Hereinafter, during the normal operation, the operation of the normal reference voltage generating unit 420 and the voltage detection unit 430 will be described with reference to FIG. 7.

The normal reference voltage generating unit 420 has a current mirror structure, and generates the reference voltage V_REF to which an input resistance lower than that of the first resistors R1 and R11 is incorporated. The normal reference voltage generating unit 420 includes a reference current generating unit IS and PM3, and a mirror current generating unit PM1 and PM2. The reference current generating unit IS and PM3 generates the reference current corresponding to the reference voltage V_REF. The mirror current generating unit PM1 and PM2 generates a mirror current corresponding to the reference current. Thus, during the normal operation, the normal reference voltage generating unit 420 generates the reference voltage V_REF using the mirror current.

As shown in FIGS. 6 and 7, a negative voltage generator in accordance with an embodiment of the present invention uses the first resistors R1 and R11 during the test operation, and does not use the first resistors R1 and R11 during the normal operation when the reference voltage V_REF is generated.

Thus, during the test operation, the internal voltage generator in accordance with an embodiment of the present invention may minimize the dispersion value of the negative voltage by using a high input resistance, and use a low power supply voltage by using a low input resistance during the normal operation.

Figure 8:
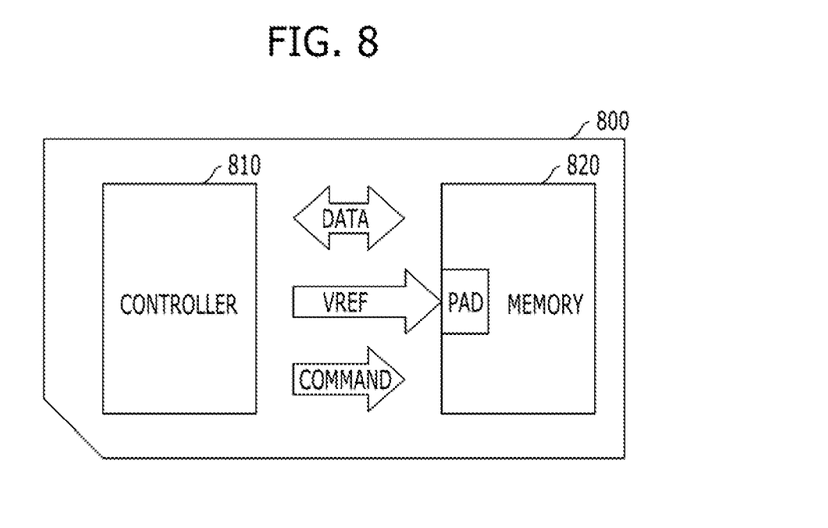
FIG. 8 is a block diagram illustrating a memory system in accordance with an embodiment of the present invention.

FIG. 8 is a block diagram illustrating a memory system.

As shown in FIG. 8, a memory system 800 may include a controller 810 and a memory 820. The controller 810 and the memory 820 may exchange electrical signals. To be specific, the memory 820 and the controller 810 may exchange a data in response to a command of the controller 810. Thus, the memory 820 may store the data received from the controller 810 and output the data to the controller 810. The memory 820 may include the semiconductor device having aforementioned internal voltage generator. The memory 820 may include a pad PAD through which the memory 820 receives an external reference voltage VREF from the controller 810. The memory system 800 may be used as a data storage medium for diverse portable devices. For example, the memory system 800 may include a memory stick card, a smart media card (SM), a secure digital card (SD), a mini secure digital card (mini SD), or a multi media card (MMC).

Figure 9:
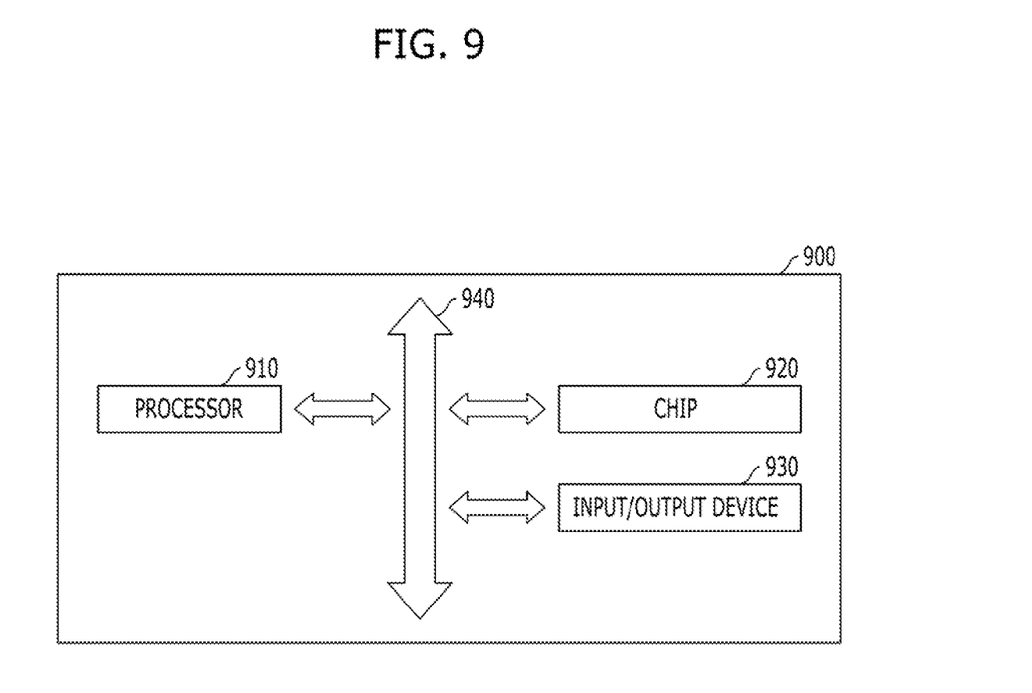
FIG. 9 is a block diagram illustrating an electronic system in accordance with an embodiment of the present invention.

FIG. 9 is a block diagram illustrating an electronic system.

As shown in FIG. 9 the electronic system 900 may include a processor 910, an input/output device 930 and a chip 920 which perform a data communication through a bus 940. The processor 910 performs a program and controls the electronic system 900. The input/output device 930 may be used in inputting or outputting data to or from the electronic system 900. The electronic system 900 may be coupled to an external device, such as a personal computer or a network, and exchange data with the external device by using the input/output device 930. The chip 920 may store a code and data for the operation of the processor 910 and perform an operation applied by the processor 910. For example, the chip 920 may include the semiconductor device having aforementioned internal voltage generator. The electronic system 900 may include diverse electronic control devices having the chip 920. For example, the electronic system 900 may be used for mobile phones, MP3 players, navigators, solid-state disk (SSD), household appliances, and the like.

As described above, an internal voltage generator in accordance with an embodiment of the present invention may guarantee a stable dispersion value during the test operation and a low power operation during the normal operation by controlling circuits, which operate independently during the test operation and the normal operation.

While the present invention has been described with respect to the specific embodiments, it will be apparent to those skilled in the art that various changes and modifications may be made without departing from the spirit and scope of the invention as defined in the following claims.

What is claimed is:

1. A voltage detection circuit, comprising:
   a voltage detection unit suitable for comparing a voltage level of a reference voltage terminal with a voltage level of an internal voltage terminal and for generating a detection signal based on a comparison result;
   a test reference voltage generating unit suitable for receiving an external reference voltage through a pad and for supplying a test reference voltage, which is generated by using the received external reference voltage, to the reference voltage terminal by using a first input resistance, during a test operation; and
   a normal reference voltage generating unit having a current mirror structure, wherein the normal reference voltage generating unit is suitable for supplying a current, corresponding to an internal reference voltage, to the reference voltage terminal by using a second input resistance different from the first input resistance, during a normal operation.

2. The voltage detection circuit of claim 1, wherein the first input resistance is higher than the second input resistance.

3. The voltage detection circuit of claim 2, wherein the internal voltage terminal is a negative voltage terminal.

4. An operation method of a voltage detection circuit, comprising:
   receiving an external reference voltage through a pad to generate a test reference voltage by using the received external reference voltage, during a test operation;
   detecting a voltage level of a target internal voltage based on a voltage level of the test reference voltage during the test operation;
   forming a minor current using a current minor structure to generate a normal reference voltage by using the mirror current, during a normal operation; and
   detecting the voltage level of the target internal voltage based on a voltage level of the normal reference voltage during the normal operation.

5. The operation method of claim 4, wherein the generating of the normal reference voltage comprises:
   generating a reference current corresponding to the normal reference voltage; and
   generating the mirror current based on the reference current.

6. The operation method of claim 4, wherein the target internal voltage is a negative voltage.

7. An internal voltage generator, comprising:
   a voltage detection unit suitable for comparing a voltage level of an internal voltage terminal with a voltage level of a reference voltage terminal and for generating a detection signal based on a comparison result;
   a test reference voltage generating unit suitable for receiving an external reference voltage through a pad during a test operation and for supplying a test reference voltage, which is generated by using the received external reference voltage, to the reference voltage terminal by using a first input resistance, during the test operation;
   a normal reference voltage generating unit having a current mirror structure, wherein the normal reference voltage generating unit is suitable for supplying a mirror current, corresponding to an internal reference voltage, to the reference voltage terminal by using a second input resistance different from the first input resistance, during a normal operation;
   an oscillation unit suitable for generating an oscillation signal in response to the detection signal; and
   a pumping unit suitable for generating a negative voltage by using a charge pumping operation based on the oscillation signal and for supplying the negative voltage to the internal voltage terminal.

8. The internal voltage generator of claim 7, wherein the test reference voltage generating unit comprises:
   a switching unit suitable for selectively supplying the received external reference voltage with a predetermined ratio to the voltage detection unit during the test operation.

9. The internal voltage generator of claim 7, wherein the normal reference voltage generating unit comprises:
   a reference current generating unit suitable for generating a reference current corresponding to the internal reference voltage; and
   a mirror current generating unit suitable for generating the mirror current based on the reference current.

10. The internal voltage generator of claim 9, further comprising:
    an activation control unit suitable for controlling an activation of the mirror current generating unit based on the operations.

11. The internal voltage generator of claim 8, wherein the test reference voltage generating unit comprises:
    a resistance unit having a first resistance coupled between the pad and the switching unit.

* * * * *